United States Patent
Zalewski (12)

(10) Patent No.: US 9,123,008 B2
(45) Date of Patent: Sep. 1, 2015

(54) BUILDABLE PART PAIRS IN AN UNCONFIGURED PRODUCT STRUCTURE

(75) Inventor: Zbigniew Zalewski, Mountain View, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 661 days.

(21) Appl. No.: 13/483,360

(22) Filed: May 30, 2012

(65) Prior Publication Data

US 2013/0325365 A1     Dec. 5, 2013

(51) Int. Cl.
| | | |
|---|---|---|
| G06Q 50/04 | (2012.01) |
| G06Q 10/06 | (2012.01) |
| G06F 17/50 | (2006.01) |
| G06F 17/00 | (2006.01) |
| G06Q 30/06 | (2012.01) |
| G06K 9/62 | (2006.01) |

(52) U.S. Cl.
CPC ............ *G06Q 10/0631* (2013.01); *G06F 17/50* (2013.01); *G06F 17/60* (2013.01); *G06Q 30/0621* (2013.01); *G06Q 50/04* (2013.01); *G06K 9/6218* (2013.01)

(58) Field of Classification Search
CPC ... G06F 17/50; G06F 17/30713; G06Q 10/06; G06Q 10/087; G06Q 30/0621; G06K 9/6226
USPC ................................. 341/107; 702/33; 700/95
See application file for complete search history.

(56) References Cited

U.S. PATENT DOCUMENTS

| | | | |
|---|---|---|---|
| 2003/0171829 A1 | 9/2003 | Fisher et al. |
| 2003/0204527 A1* | 10/2003 | Callahan .................... 707/104.1 |
| 2004/0140976 A1* | 7/2004 | Callahan ....................... 345/419 |
| 2007/0055638 A1* | 3/2007 | Kaup et al. .................... 705/400 |
| 2008/0010620 A1 | 1/2008 | Moeller et al. |
| 2008/0114719 A1* | 5/2008 | Anderson et al. ................. 707/2 |
| 2008/0162379 A1* | 7/2008 | Weiler et al. .................. 705/400 |
| 2009/0070368 A1* | 3/2009 | Callahan ....................... 707/102 |
| 2010/0114355 A1* | 5/2010 | Harashima et al. ........... 700/107 |
| 2010/0241300 A1 | 9/2010 | Aekka et al. |
| 2011/0225070 A1 | 9/2011 | Johnson et al. |

OTHER PUBLICATIONS

PCT Search Report dated Nov. 26, 2013, for PCT/US2013/040233. (9 pages).

* cited by examiner

*Primary Examiner* — John Breene
*Assistant Examiner* — Christine Liao

(57) ABSTRACT

Systems and methods for identifying unbuildable part pairs in product data management (PDM) systems. A method includes receiving a product structure having a plurality of nodes with variant conditions. The method includes building, by the client PDM system, a variant condition forest (VCF) corresponding to the product structure and selecting a pair of nodes in the product structure. The method includes determining, using the VCF, whether the variant conditions of each of the selected nodes are satisfiable both separately and at the same time, and if not, marking the selected pair of nodes as unbuildable. The method includes adding the unbuildable pair of nodes to an unbuildable pairs list. The method includes performing a clearance analysis process on the product structure, without processing unbuildable pairs on the unbuildable pairs list, and storing the results of the clearance analysis process.

20 Claims, 9 Drawing Sheets

FIG. 4

| PRODUCT STRUCTURE TREE NODES | VARIANT CONDITION FOREST NODE |
|---|---|
| 1 | NULL |
| 2 | NULL |
| 3 | NULL |
| 4 | 2 |
| 5 | 1 |
| 6 | 1 |
| 7 | 1 |
| 8 | 5 |
| 9 | 3 |
| 10 | 3 |
| 11 | 4 |
| 12 | 4 |
| 13 | 4 |
| 14 | 7 |
| 15 | 7 |
| 16 | 7 |
| 17 | 6 |
| 18 | 10 |
| 19 | 10 |
| 20 | 8 |
| 21 | 9 |

BUILDABLE PART PAIRS IN AN UNCONFIGURED PRODUCT STRUCTURE

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include systems and methods for improved PDM processes, including systems and methods for identifying unbuildable part pairs. A method includes receiving a product structure having a plurality of nodes with variant conditions. The method includes building, by the client PDM system, a variant condition forest (VCF) corresponding to the product structure and selecting a pair of nodes in the product structure. The method includes determining, using the VCF, whether the variant conditions of each of the selected nodes are satisfiable both separately and at the same time, and if not, marking the selected pair of nodes as unbuildable. The method includes adding the unbuildable pair of nodes to an unbuildable pairs list. The method includes performing a clearance analysis process on the product structure, without processing unbuildable pairs on the unbuildable pairs list, and storing the results of the clearance analysis process.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 4 illustrates the node mapping from the product structure tree of FIG. 2 to the VCF of FIG. 3, by node number, in accordance with disclosed embodiments.

DETAILED DESCRIPTION

Figure 1:
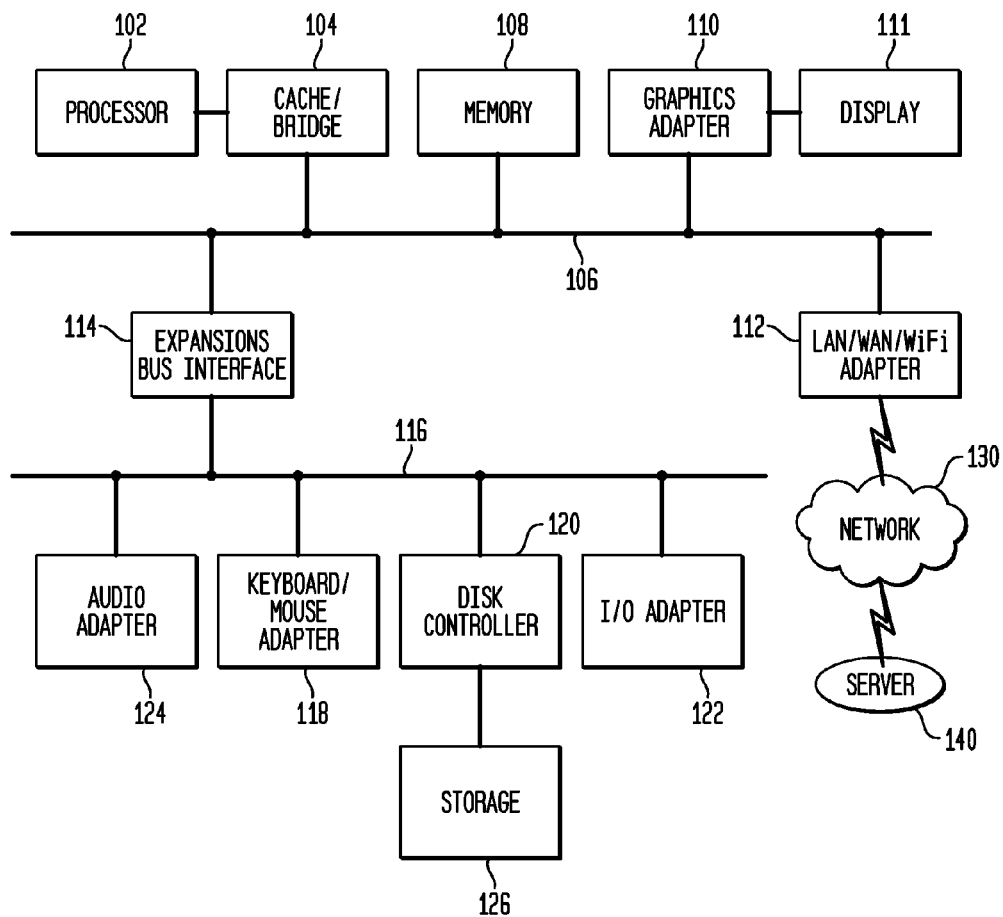
FIG. 1 depicts a block diagram of a data processing system in which an embodiment can be implemented.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

The determination of nonbuildable and buildable part pairs in an unconfigured product structure, such as a product Bill of Materials ("BOM") structure, is important in performing the clearance analysis of large digital product models. The "product structure" refers to a data structure that represents a product. The unconfigured product is the union of all product variants for the product as represented in the structure. "Nonbuildable" part pairs of the unconfigured model are such part pairs that do not exist in any product variants. That is, any variant may include one or the other of the two parts, but no variant includes both of those two parts, so the "pair" are exclusive of each other.

The choice of the unconfigured product for the scope of the clearance analysis is driven by the requirement of completeness of the analysis. A choice of a subset of variants of a product may lead to omissions of valid clearance issues. In order to make such a complete analysis practical, nonbuildable part pairs within the model need to be identified and excluded from the clearance analysis. Otherwise, non-existent part pair relationships are analyzed with no added value while increasing the infrastructure cost and the time to compute. More importantly, engineers and designers are required to evaluate irrelevant clearance incidents, which is costly and unnecessary.

Nonbuildable part pairs can be identified and excluded from the clearance analysis by employing two conventional mechanisms.

A first conventional approach relies on the creation and querying of the pair exclusion rulebase referencing attributes of nodes of the product structure. This approach requires that the rulebase be created and maintained outside of a PDM system, solely in support of the clearance analysis, as a separate model, usually reflecting a subset of the variant model hosted by a PDM system. This mechanism, while adopted for large models, calls for a duplicate modeling effort that, due to its complexity, results in an incomplete variant statement where most, but not all, nonbuildable part pairs are excluded from the clearance analysis.

A second conventional approach involves querying the variant model already created and maintained in a PDM system. This mechanism builds on the existent PDM system model in that it provides for complete exclusion of nonbuildable part pairs from the clearance analysis. However, the need for direct interaction with a PDM system and its entire data model during the clearance analysis, while satisfying general buildability queries, in be architecturally complex, and therefore is difficult to deploy and operate. Such an approach is also impractically slow in the case of large models.

Disclosed embodiments include systems and methods that can identify nonbuildable part pairs in the clearance analysis computer system based on the textual representation of variant conditions. These variant conditions are attributes of a textual representation of the product structure of an unconfigured product extracted from a PDM system. Disclosed embodiments focus on the determination of buildable part pairs in support of the clearance analysis, and build on existing clearance analysis systems and methods.

Disclosed embodiments provide distinct technical advantages over conventional systems. For example, disclose embodiments are significantly faster than conventional processes, and the time required to establish nonbuildable part pairs in support of the clearance analysis becomes insignificant compared to the time required to perform the complete clearance analysis, in contrast to dominating the clearance analysis in prior systems.

Disclosed embodiments also provide the advantage of architectural simplicity where a single computer application suffices to perform variant-aware clearance calculations, resulting in simpler deployment and operations.

The aforementioned benefits make the variant-aware clearance analysis of large product models practical—fast and therefore repeatable as needed. A large product model, as used herein, refers to models having the number of BOM lines of the order of $10^5$.

FIG. 1 depicts a block diagram of a data processing system in which an embodiment can be implemented, for example as a PDM system or clearance system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

One technique for a clearance process includes steps of loading the appropriate data on a local system for performing the clearance analysis. In particular embodiments, this can be performed using the TEAMCENTER and TEAMCENTER VISUALIZATION products by Siemens Product Lifecycle Management Software Inc. For example, such as process can extract the product structure of an unconfigured product in the form of a product tree structure, such as a PLMXML file, that references geometric representations of product assemblies and parts in a PLM system such as implemented by the TEAMCENTER product. The specific examples below are made in reference to the TEAMCENTER product, but apply to similar processes of any PDM system.

Such a process can preload a cache so that all geometric representations referenced by the PLMXML file are stored as local files, and can modify the PLMXML file so it references local data rather than TEAMCENTER objects. The local files can be, for example, in the "JT" file format known to those of skill in the art.

The process can then perform a clearance analysis on the PLMXML file, and in doing so, can access a clearance requirements rulebase and a design context database that acts as the source of part-pair buildability knowledge.

Various embodiments described herein provide additional and alternate capabilities and processes. In various embodiments, variant conditions such as BOMLine properties are included in the PLMXML file as attributes of nodes of the product structure. The clearance process can then determine the part pair buildability based on the variant condition information determined from the content of the PLMXML file. In particular, in various embodiments, there is no need for part pair buildability queries against a design context database as in other systems. As such, disclosed embodiments only need a single application and tier to answer part pair buildability questions. This is an architecturally simpler solution than other approaches.

Disclosed embodiments can identify buildable and non-buildable part pairs on the client system rather than on the server side, by using a client application/process with respect to a PDM server system that maintains the entire BOM structure. The client system can treat the determination of buildable part pairs as a satisfiability question of Boolean expressions for variant conditions. Furthermore, various embodiments divide the entire task of determining the satisfiability of the Boolean product of all the variant conditions affecting given part pair into a number of smaller tasks of the determination of satisfiability of variant condition pairs. "Satisfiability" refers to a determination as to whether the variant conditions, or combination of variant conditions, is capable of being satisfied in the context of the BOM structure, as opposed to situations, for example, where the variant conditions directly conflict so that that combination of variant conditions, such as defined by a part pair, can never be satisfied.

A process in accordance with disclosed embodiments can include parsing textual variant conditions into directed graphs of their terms and decomposing the variant conditions into disjunctive normal form (DNF), which enables an efficient solution to the determination of whether a pair of variant conditions can be satisfied. Disclosed embodiments not only determine if an individual variant condition or a pair of variant conditions can be satisfied, but also include novel techniques for determining the buildability of part pairs based on the whether pairs of variant conditions can be satisfied and on the topology of individual variant conditions within the product structure.

Disclosed embodiments can initially determine whether individual unique variant conditions can be satisfied. In most cases, a BOM structure will not intentionally include variant conditions that cannot be satisfied, but the presence of such conditions can cause a large amount of wasted processing. Disclosed embodiment can identify any individual variant conditions that cannot be satisfied and exclude all product structure node pairs subjected to those variant conditions from any further clearance processing.

Disclosed embodiments can also determine whether pairs of unique variant conditions can be satisfied. After the two respective variant conditions are expressed in their disjunctive normal forms, a pair of disjunctive normal forms can be satisfied when at least one of the pairs of implicants of such expressed respective variant conditions can be satisfied.

Disclosed embodiments can also determine whether variant conditions with respect to two given nodes of the product structure can be satisfied.

A product structure as described herein can be represented as a graph, in particular as a tree where the root of the tree corresponds to the top node of the product and other nodes correspond to assemblies and parts of the product.

Figure 2:
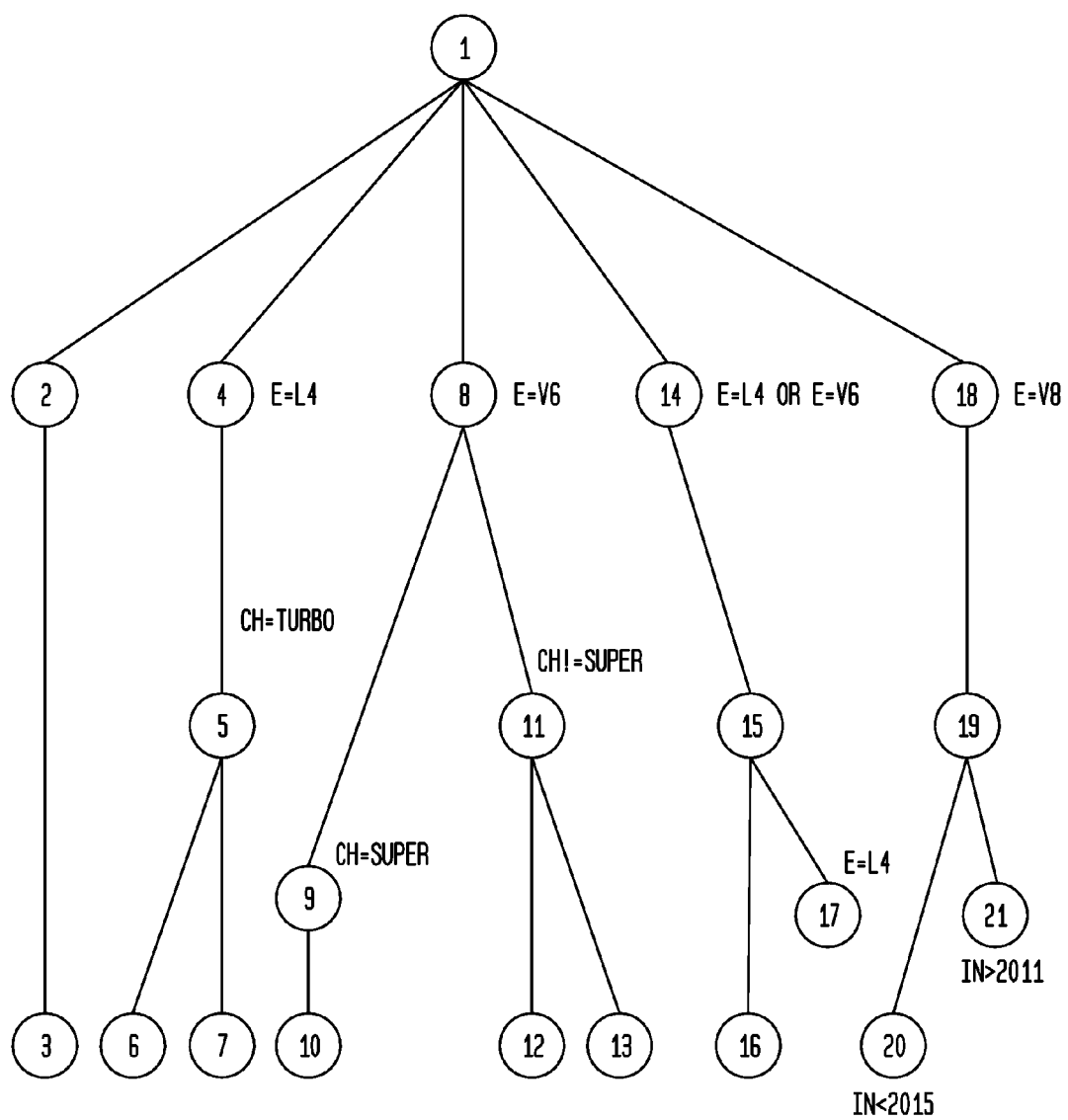
FIG. 2 shows an example of a product structure with textual variant conditions in accordance with disclosed embodiments.

FIG. 2 shows an example of a product structure represented as a tree, and in particular shows an example of a product structure tree with textual variant conditions. Variant conditions are attached to some nodes of such a tree. The set of variant conditions affecting a particular pair of the product structure tree nodes is defined by the topology of the tree. The determination of the buildability of pairs of nodes in the product structure tree is a complex problem that can be of quadratic complexity in respect to the cardinality of the product structure tree.

In FIG. 2, the overall product can be represented at node 1, while various ones of the other nodes are associated with particular variant conditions. A node associated with a variant condition is subjected to that variant condition. Where a node is subjected to a variant condition, all of its children nodes are also subjected to that variant condition. In general, a node may be subjected to many variant conditions. For example, node 4 is subjected to the variant condition "E=L4", where "E" is a product option name and "L4" is an option value, and so nodes 5, 6, and 7 are all subjected to that variant condition. Additionally nodes 5, 6, and 7 are subjected to the variant condition "CH=TURBO". Variant conditions are arbitrarily complex Boolean expressions where product option names are compared to option values. The system can convert those Boolean expressions to disjunctive normal form.

Disclosed embodiments can use an auxiliary representation of topological relationships among variant conditions, referred to herein as a "Variant Condition Forest" ("VCF"). The Variant Condition Forest is a union of disjoint trees that consists of nodes in the product structure tree which have variant conditions while the "lines" of the forest preserve ancestor-descendant relationships of the product structure tree.

Figure 3:
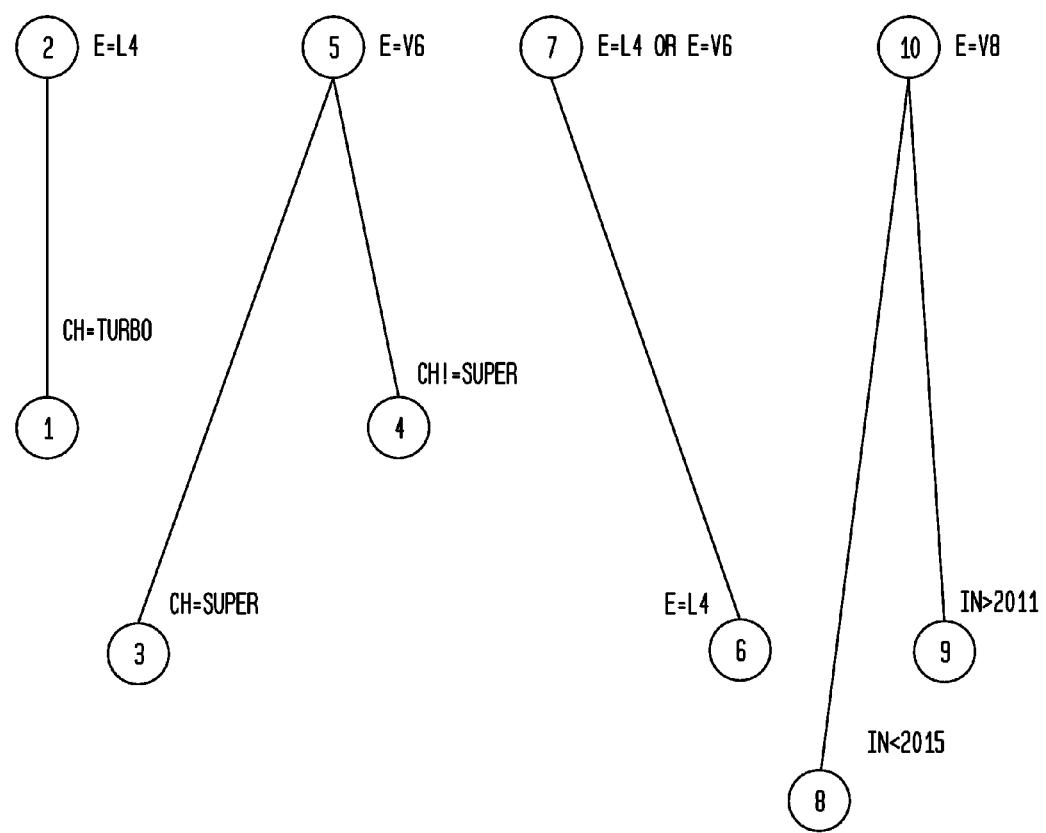
FIG. 3 depicts a Variant Condition Forest corresponding to the product structure tree of FIG. 2, in accordance with disclosed embodiments.

FIG. 3 depicts a Variant Condition Forest corresponding to the product structure tree of FIG. 2. The benefit of the creation of the VCF is in the fact that the satisfiability questions posed in the context of the product structure tree can be directly mapped to satisfiability questions posed in the context of the VCF. This is true because the VCF is a graph of a significantly lesser cardinality than the cardinality of the product structure tree in real-life products.

As shown in FIG. 3, the VCF shows a collection of nodes, arranged in separate trees, including each of the nodes in the tree of FIG. 2 that have a specific variant condition associated with it. Note that therefore there are significantly fewer nodes in the VCF than in the product structure tree. Node 2 of FIG. 3, with variant condition "E=L4" corresponds to node 4 of the tree of FIG. 2, for example, and each of the variant-condition nodes of FIG. 2 are represented in FIG. 4. Parent-child connections are only recognized where a parent node with a variant condition in the original tree has a descendant node with its own variant condition, and these are shown in the VCF as connected but with any intervening nodes removed if the intervening nodes do not have a separate variant condition, as described more specifically below.

By performing buildability checking on the VCF, the computational effort required to solve the total buildability task is reduced significantly.

The mapping of the satisfiability queries from the product structure tree to the VCF is implemented with the assistance of the mapping between the nodes of the respective graphs. Nodes of the product structure tree with variant conditions are mapped to their VCF equivalents. Nodes of the product structure tree not directly associated with variant conditions but subjected to at least one variant condition are mapped to VCF equivalents of their nearest ancestor with a variant condition attached. Nodes of the product structure tree not subjected to any variant conditions are mapped to the NULL node and can be omitted.

The node mapping from the product structure tree of FIG. 2 to the VCF of FIG. 3, by node number, is presented in FIG. 4. Node pairs involving the NULL node are always satisfiable. Additionally, distinct variant conditions are identified and ordered (sorted) so they can be referenced efficiently as described below.

The system can also identify distinct variant conditions and assign them respective index values.

Table 1 shows an example of a mapping of VCF nodes, as shown in the example of FIG. 3, to distinct and ordered variant conditions.

TABLE 1

| Variant Condition Forest Node | Distinct Variant Condition | Distinct Variant Condition Index |
|---|---|---|
| 1 | CH = TURBO | 3 |
| 2 | E = L4 | 4 |
| 3 | CH = SUPER | 2 |
| 4 | CH != SUPER | 1 |
| 5 | E = V6 | 6 |
| 6 | E = L4 | 4 |
| 7 | E = L4 OR E = V6 | 5 |
| 8 | IN < 2015 | 8 |
| 9 | IN > 2011 | 9 |
| 10 | E = V8 | 7 |

Various embodiments can also include a Two-Level Satisfiability Cache. The benefit of the cache is such that the same satisfiability questions expressed in terms of the VCF nodes and satisfiability questions posed in terms of variant conditions themselves are resolved efficiently. These questions are posed numerous times in support of satisfiability questions expressed in terms of the nodes of the product structure tree, are evaluated at most once (in response to the first question) and just queried otherwise (in response to subsequent questions). This cache stores satisfiability determinations for nodes of the VCF and for distinct variant conditions.

Level 1 of the cache stores answers to satisfiability questions posed in terms of nodes of the VCF. Table 2 shows an example of Level 1 of a completely populated Satisfiability Cache of the Variant Condition Forest of FIG. 3.

TABLE 2

| 1 | 2 | 3 | 4 | 5 | 6 | 7 | 8 | 9 | 10 | VCF Node |
|---|---|---|---|---|---|---|---|---|---|---|
| 11 | 11 | 10 | 10 | 10 | 11 | 11 | 10 | 10 | 10 | 1 |
|    | 11 | 10 | 10 | 10 | 11 | 11 | 10 | 10 | 10 | 2 |
|    |    | 11 | 10 | 11 | 10 | 11 | 10 | 10 | 10 | 3 |
|    |    |    | 11 | 11 | 11 | 11 | 10 | 10 | 10 | 4 |
|    |    |    |    | 11 | 10 | 11 | 10 | 10 | 10 | 5 |
|    |    |    |    |    | 11 | 11 | 10 | 10 | 10 | 6 |
|    |    |    |    |    |    | 11 | 10 | 10 | 10 | 7 |
|    |    |    |    |    |    |    | 11 | 11 | 11 | 8 |
|    |    |    |    |    |    |    |    | 11 | 11 | 9 |
|    |    |    |    |    |    |    |    |    | 11 | 10 |

Level 2 of the cache stores answers to satisfiability questions posed in terms of distinct variant conditions. Table 3 shown an example of Level 2 of a completely populated Satisfiability Cache of the Variant Condition Forest of FIG. 3.

TABLE 3

| 1 | 2 | 3 | 4 | 5 | 6 | 7 | 8 | 9 | VC Index | VC |
|---|---|---|---|---|---|---|---|---|---|---|
| 11 | 10 | 11 | 11 | 11 | 11 | 11 | 11 | 11 | 1 | CH != SUPER |
|    | 11 | 10 | 11 | 11 | 11 | 11 | 11 | 11 | 2 | CH = SUPER |
|    |    | 11 | 11 | 11 | 11 | 11 | 11 | 11 | 3 | CH = TURBO |
|    |    |    | 11 | 11 | 10 | 10 | 11 | 11 | 4 | E = L4 |
|    |    |    |    | 11 | 11 | 10 | 11 | 11 | 5 | E = L4 OR E = V6 |
|    |    |    |    |    | 11 | 10 | 11 | 11 | 6 | E = V6 |
|    |    |    |    |    |    | 11 | 11 | 11 | 7 | E = V8 |
|    |    |    |    |    |    |    |    | 11 | 8 | IN < 2015 |
|    |    |    |    |    |    |    |    |    | 9 | IN > 2011 |

Both Satisfiability Cache levels store satisfiability answers as two-bit numbers, and pack the answers into bit vectors. The high bit of the two-bit number indicates whether a particular satisfiability answer is known. If a satisfiability answer is known, the lower bit represents the proper binary answer as to whether or not it is satisfiable. The benefit of this implementation is a high efficiency of satisfiability queries once the satisfiability is established. The position of bits of interest in the cache bit vectors is computed as a simple arithmetic expression based on natural numbers assigned to nodes of the VCF nodes and variant conditions for Level 1 and 2, respectively. The computational complexity of such queries is of order 1. Cardinalities of the VCF and the variant condition set found in large real life models are still small enough for the Satisfiability Cache to be stored entirely in the main memory.

A clearance analysis application typically poses buildability/satisfiability questions in terms of nodes of the product structure tree. Those nodes can relate to both parts and assemblies. While any node of the product structure can be involved in satisfiability queries, often only a subset of nodes is involved. In general, not all answers to satisfiability questions expressed in terms of the VCF nodes and in terms of variant conditions need to be known in order to answer all questions posed by the clearance analysis process.

In some cases, the system can evaluate part pairs for their inclusion in the clearance analysis process by considering possibly maximal branches of the product structure. In particular, for each part of the "left-hand" side maximal branches of the "right-hand" side are considered first. If a part-branch pair is buildable then part-sub-branch pairs are evaluated recursively. If part-branch pair is not buildable then such a pair is not included in the clearance analysis and not investigated at the part-sub-branch level. For example, for node (part) 10 of FIG. 2, pair 10-4 is buildable and needs to be explored further, while pair 10-18 is not buildable and therefore part pairs 10-20 and 10-21 are excluded from the clearance analysis.

In general, not all satisfiability relationships in the product structure need to be determined in order to establish buildable part pairs. The states of Level 1 and Level 2 Satisfiability Caches after the completion of the analysis of the product structure of FIG. 3 are depicted in Tables 4 and 5, respectively. Satisfiability relationships with no need to be evaluated are those with the higher bit set to 0.

Table 4 shows the Level 1 Satisfiability Cache of the Variant Condition Forest of FIG. 3 populated in support of the clearance analysis of the product structure in FIG. 2.

TABLE 4

| 1 | 2 | 3 | 4 | 5 | 6 | 7 | 8 | 9 | 10 | VCF Node |
|---|---|---|---|---|---|---|---|---|---|---|
| 11 | 11 | 10 | 10 | 10 | 11 | 11 | 10 | 10 | 10 | 1 |
|    | 11 | 00 | 00 | 10 | 11 | 11 | 00 | 00 | 00 | 2 |

TABLE 4-continued

| 1 | 2 | 3 | 4 | 5 | 6 | 7 | 8 | 9 | 10 | VCF Node |
|---|---|---|---|---|---|---|---|---|----|----------|
|   |   | 11 | 10 | 11 | 10 | 11 | 10 | 00 | 10 | 3 |
|   |   |   | 11 | 11 | 11 | 11 | 00 | 00 | 10 | 4 |
|   |   |   |   | 11 | 10 | 11 | 00 | 00 | 10 | 5 |
|   |   |   |   |   | 11 | 11 | 00 | 00 | 10 | 6 |
|   |   |   |   |   |   | 11 | 00 | 00 | 10 | 7 |
|   |   |   |   |   |   |   | 11 | 11 | 11 | 8 |
|   |   |   |   |   |   |   |    | 11 | 11 | 9 |
|   |   |   |   |   |   |   |    |    | 11 | 10 |

Table 5 depicts the Level 2 Satisfiability Cache of the Variant Condition Forest of FIG. 3 populated in support of the clearance analysis of the product structure in FIG. 2.

TABLE 5

| 1 | 2 | 3 | 4 | 5 | 6 | 7 | 8 | 9 | VC Index | VC |
|---|---|---|---|---|---|---|---|---|----------|----|
| 11 | 10 | 00 | 11 | 11 | 11 | 00 | 00 | 00 | 1 | CH ! = SUPER |
|    | 11 | 00 | 11 | 11 | 11 | 00 | 00 | 00 | 2 | CH = SUPER |
|    |    | 11 | 11 | 11 | 11 | 11 | 00 | 00 | 3 | CH = TURBO |
|    |    |    | 11 | 11 | 10 | 10 | 00 | 00 | 4 | E = L4 |
|    |    |    |    | 11 | 11 | 10 | 00 | 00 | 5 | E = L4 OR E = V6 |
|    |    |    |    |    | 11 | 10 | 00 | 00 | 6 | E = V6 |
|    |    |    |    |    |    | 11 | 11 | 11 | 7 | E = V8 |
|    |    |    |    |    |    |    | 11 | 11 | 8 | IN < 2015 |
|    |    |    |    |    |    |    |    | 11 | 9 | IN > 2011 |

Figure 5:
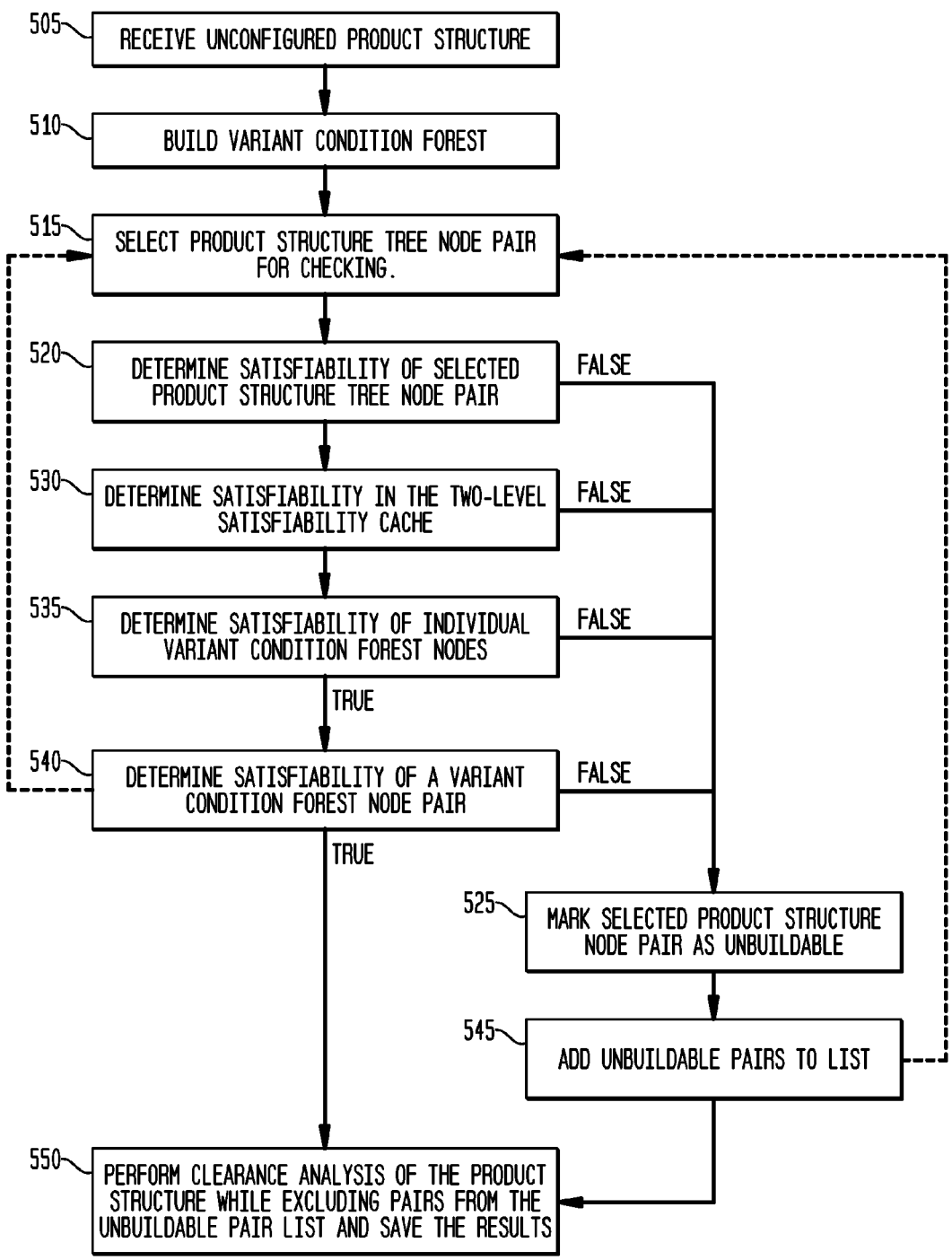
FIGS. 5-9 depict flowcharts of processes in accordance with disclosed embodiments.

FIG. 5 depicts a flowchart of a recursive process to determine the buildability/satisfiability of product structure tree nodes and remove unbuildable nodes from a product structure. This process builds on the creation of the VCF and the presence of the two-level satisfiability cache. The method is presented as four actions that can be executed in a recursive manner, and can include subprocesses illustrated below in separate flowcharts. As used below, "system" refers to one or more data processing systems performing actions as described herein, and can be implemented in particular as a client PDM data processing system.

The system receives an unconfigured product structure, such as an unconfigured BOM structure, that includes a plurality of nodes having variant conditions (step 505). In a preferred embodiment, the system receives the product structure from a server PDM data processing system. The product structure can be an entire product BOM structure, or a sub-structure of the entire product BOM structure. Each node can represent a part of the product represented by the product structure.

The system can build a VCF, as described herein, corresponding to the received product structure (step 510). This step can include initializing a two-level satisfiability cache as described above.

A product structure tree node pair is selected (step 515). The selection can be performed, for example, by a clearance analysis engine generating the list of buildable part pairs, or otherwise.

The system determines whether the variant conditions of each of the selected nodes is satisfiable, and whether they are satisfiable at the same time. If they are not, the selected node pair is marked as unbuildable and all the affected nodes can be excluded from the clearance analysis, as described in more detail below.

Figure 6:
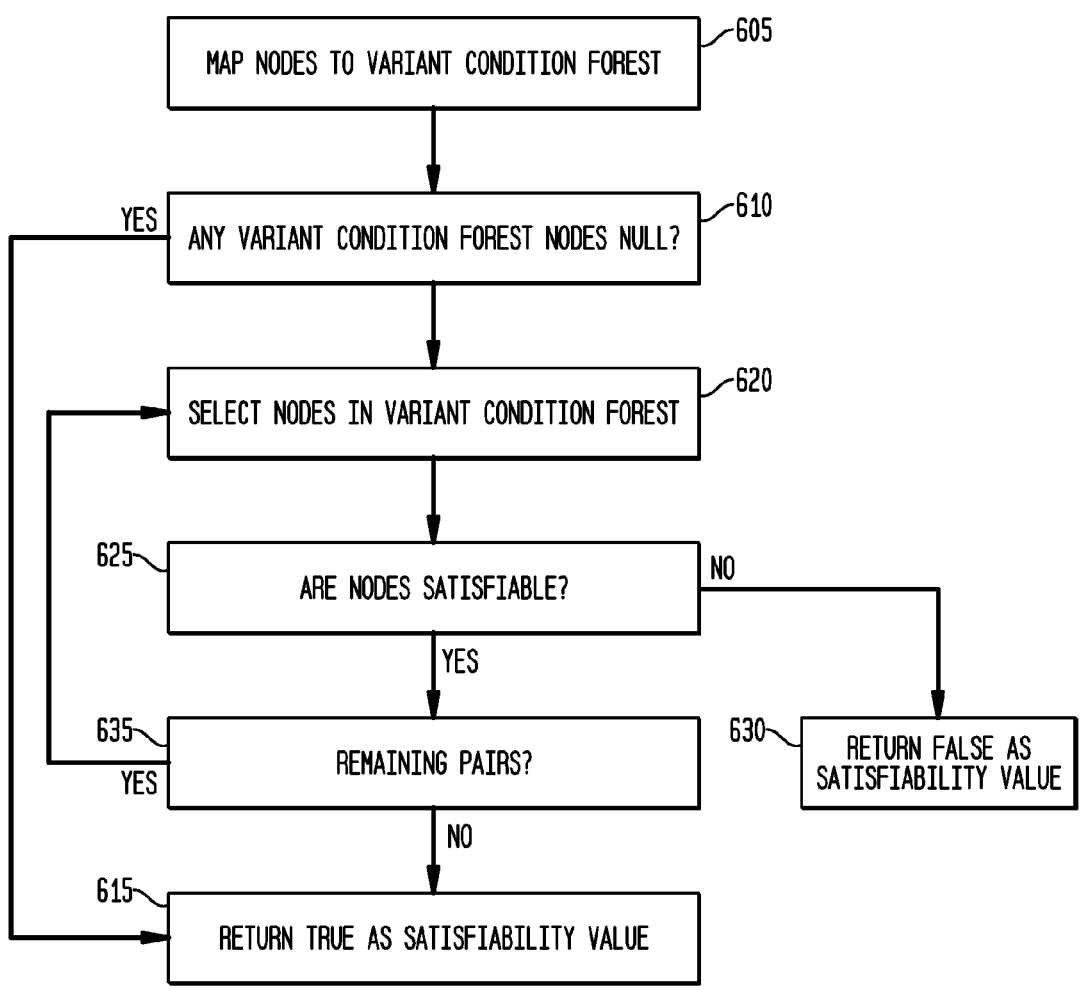

The basic action, executed repeatedly by the clearance analysis engine, is the determination of the satisfiability of a selected product structure tree node pair (step 520). FIG. 6 shows a flowchart of a subprocess for determining the satisfiability of a selected product structure tree node pair.

The system maps the product structure tree nodes to the VCF nodes (step 605).

If any of the VCF nodes is NULL (step 610), then the system immediately returns True as the product structure node pair satisfiability value (step 615).

The system sequentially and conditionally determines the satisfiability of two individual VCF nodes as well as the satisfiability of the VCF node pair in the Level 1 cache (selecting a first pair of nodes at 620). If any of the satisfiability values is False (step 625), the system immediately returns False (step 630). If there are remaining node pairs (step 635), the process returns to step 620 to select a new pair of nodes. If not, the system returns True (step 615).

Returning to the process of FIG. 5, if the subprocess returned False, then the selected product structure node pair is marked as unbuildable (step 525). Otherwise, the process continues.

Figure 7:
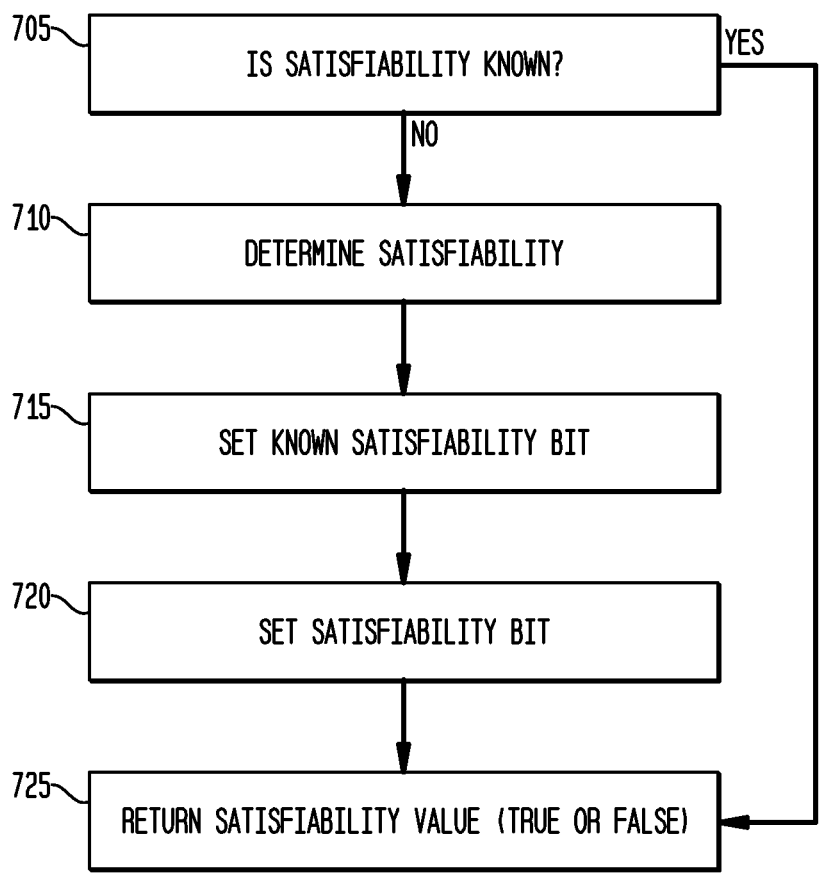

The system also determines satisfiability in the two-level satisfiability cache (step 530). FIG. 7 depicts a flowchart of a subprocess for determining satisfiability for the cache. This action is implemented in the following steps, when applied to the Level 1 cache or to the Level 2 cache.

The system queries the higher bit of a satisfiability answer to establish whether the answer is known (step 705). If the answer is known, the system returns the lower bit of the satisfiability answer as the Boolean satisfiability value (True or False) (step 725)

If the answer is not known, then the system computes the satisfiability (step 710), sets the higher bit of the satisfiability answer to True (step 715), and sets the lower bit to the computed satisfiability value (step 720). The system returns the lower bit of the satisfiability answer as the Boolean satisfiability value (True or False) (step 725).

Returning to the process of FIG. 5, if the subprocess returned False, then the selected product structure node pair is marked as unbuildable (step 525). Otherwise, the process continues.

Figure 8:
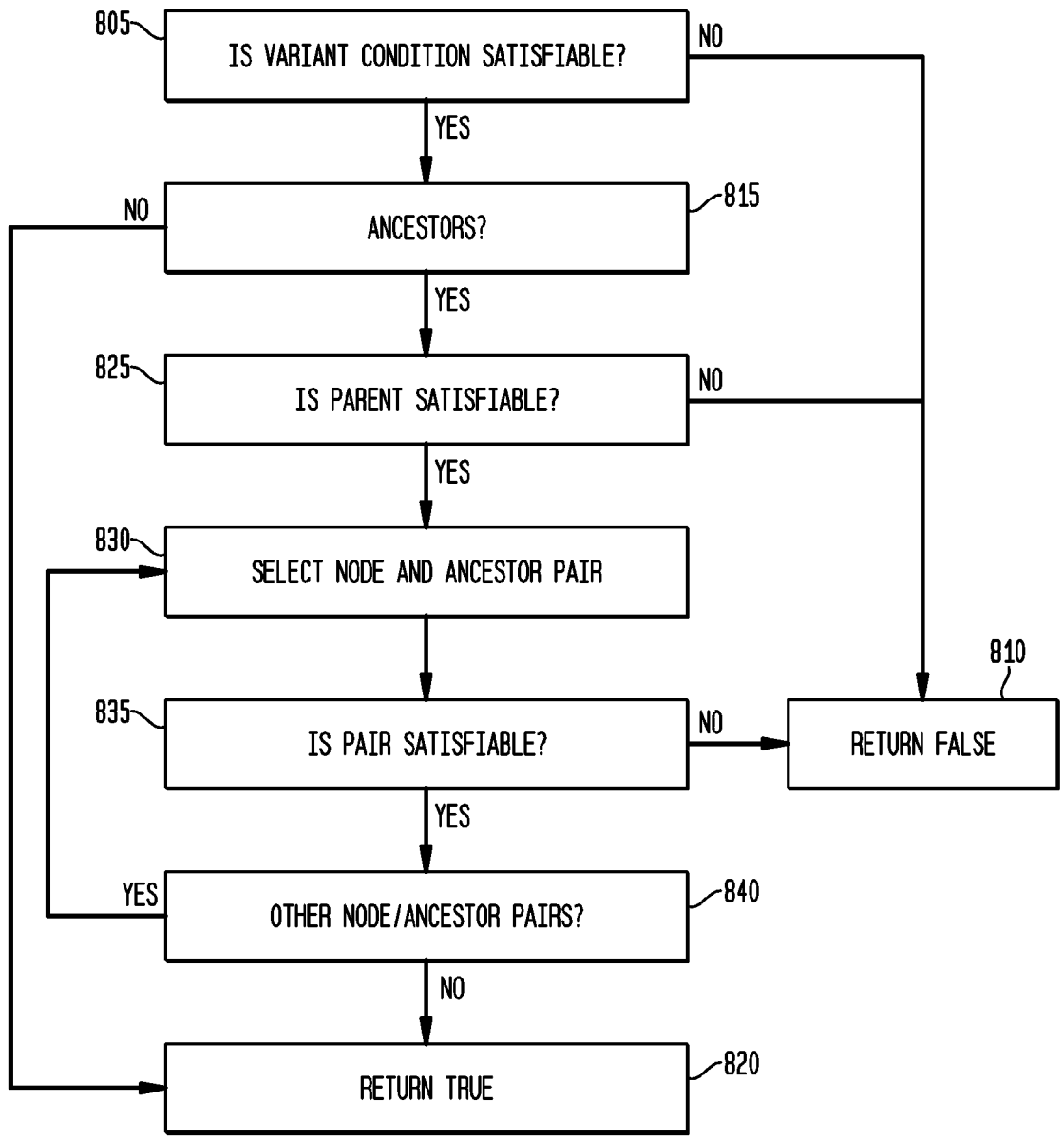

Returning to the process of FIG. 5, the system can determine the satisfiability of each individual VCF node corresponding to one node of the selected product structure node pair (step 535). FIG. 8 depicts a flowchart of a process to determine the satisfiability of an individual VCF node.

The system determines the satisfiability of the variant condition attached to the node by lookup to the Level 2 cache (step 805). The system returns False if the variant condition is not satisfiable (step 810).

If the variant condition is satisfiable at step 805, the system determines if the node has any ancestors in the VCF (step 815). If there are no ancestors in the VCF, the system returns True (step 820).

If the node does have ancestors in the VCF at step 815, the system determines the satisfiability of the parent node in the VCF by lookup to the Level 1 cache (step 825). The system will return False if the parent node is not satisfiable (step 810).

The system sequentially and conditionally determines the satisfiability of all combinations of the variant condition of the input node and variant conditions of the input node ancestors in the VCF in the Level 2 cache.

To do so, the system selects a pair of variant conditions that includes the selected node and one of its ancestors (step 830). The system determines the satisfiability value for that pair (step 835). If any of the satisfiability values is False then the system returns False (step 810). Otherwise, determines if there are other node/ancestor pairs to be checked (step 840).

If so, the system returns to step 830 to select a new pair. Otherwise, the system returns True (step 820).

Returning to the process of FIG. 5, if the subprocess returned False, then the selected product structure node pair is marked as unbuildable (step 525). Otherwise, the process continues.

Figure 9:
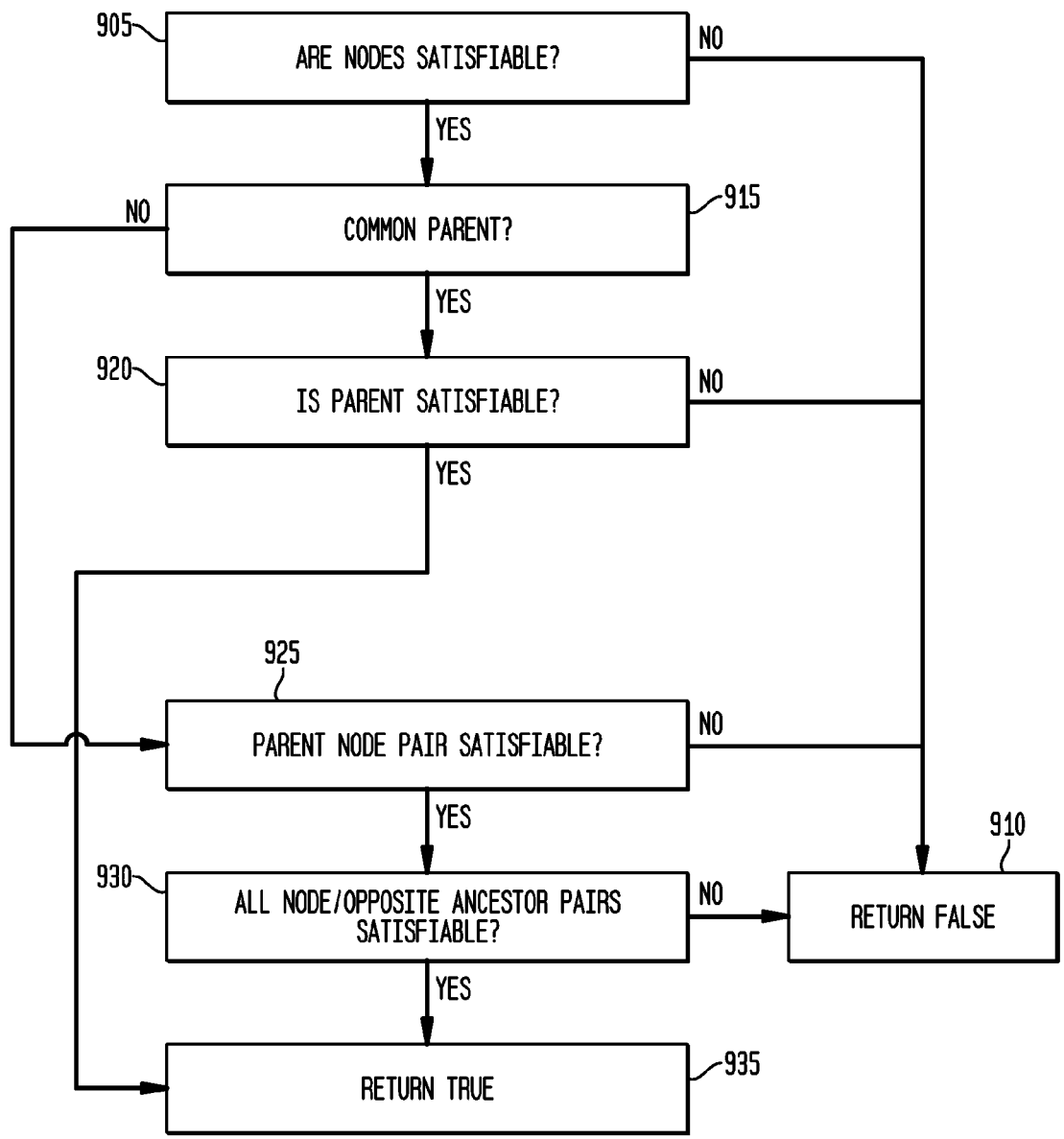

The system can determine the satisfiability of a pair of VCF nodes (step 540). FIG. 9 depicts a flowchart of a process to can determine the satisfiability of a pair of VCF nodes.

The system determines the satisfiability of each of the individual input nodes by a lookup in the Level 1 cache (step 905). If either of the satisfiability values is False then immediately return False (step 910).

The system determines if the pair of nodes in the VCF has common parent node (step 915). If so, the system determines the satisfiability of the parent node in the level 1 cache (step 920). The system returns False if the parent node is not satisfiable (step 910).

The system determines the satisfiability of the parent node pair in the level 1 cache where the pair of nodes has distinct parent nodes (step 925). The system returns False if the parent node pair is not satisfiable (step 910).

The system determines the satisfiability of all combinations of the variant condition of two respective input nodes and variant conditions of the opposite input node ancestors, in the VCF, in the Level 2 cache (step 930). If any of the satisfiability values is False then the system returns False (910). If all combinations are tested with no False results, the system returns True (step 935).

Returning to the process of FIG. 5, if the subprocess returned False, then the selected product structure node pair is marked as unbuildable (step 525). The selected product structure node pair has now been fully checked; the process can optionally return to step 515 for another product structure tree node pair.

The system can add the product structure node pairs that have been marked as unbuildable to an unbuildable pair list (step 545). The process can optionally return to step 515 for another product structure tree node pair.

The system can perform a clearance analysis using the product structure, excluding any pairs on the unbuildable pairs list (step 550), and store the clearance analysis results.

Disclosed embodiments include a number of specific technical advantages over other systems, particularly in determining of nonbuildable part pairs in PDM client systems. For example, the uniqueness of variant conditions can be determined based on the variant condition implicants set rather than on the textual representations of variant conditions. Further, the on-demand satisfiability analysis can be extended to the parsing and to the decomposition of variant conditions into the DNF form rather than performing that analysis for all variant conditions initially. Further, the parsing and the decomposition of variant conditions into the DNF form can be performed concurrently, for example in distinct threads.

Of course, those of skill in the art will recognize that, unless specifically indicated or required by the sequence of operations, certain steps in the processes described above may be omitted, performed concurrently or sequentially, or performed in a different order. Steps and operations of the various processes can be combined in various embodiments.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for identifying unbuildable part pairs, comprising:
    receiving, in a client product data management (PDM) system, a product structure having a plurality of nodes with variant conditions;
    building, by the client PDM system, a variant condition forest (VCF) corresponding to the product structure;
    selecting a pair of nodes in the product structure;
    determining, by the client PDM system and using the VCF, whether the variant conditions of each of the selected nodes are satisfiable both separately and at the same time;
    marking the selected pair of nodes as unbuildable when the variant conditions of each of the selected nodes are not satisfiable either separately or at the same time;
    adding the unbuildable pair of nodes to an unbuildable pairs list; and
    performing a clearance analysis process on the product structure, without processing unbuildable pairs on the unbuildable pairs list, and storing the results of the clearance analysis process.

2. The method of claim 1, wherein the client PDM system determines satisfiability of nodes in the VFC forest that correspond to the selected nodes.

3. The method of claim 1, wherein the client PDM system deter mines the satisfiability of ancestor nodes in the VFC forest of nodes that correspond to the selected nodes.

4. The method of claim 1, wherein the VCF forest is a union of disjoint trees that include all nodes in the product structure tree which have variant conditions.

5. The method of claim 1, wherein satisfiability determinations for nodes of the VCF are stored in a cache.

6. The method of claim 1, wherein the client PDM system determines if a common ancestor of nodes in the VCF is satisfiable.

7. The method of claim 1, wherein the product structure is an unconfigured bill of materials structure.

8. A client product data management (PDM) system comprising:
at least one processor; and
an accessible memory, the client PDM system configured to:
receive a product structure having a plurality of nodes with variant conditions;
build a variant condition forest (VCF) corresponding to the product structure;
select a pair of nodes in the product structure;
determine, using the VCF, whether the variant conditions of each of the selected nodes are satisfiable both separately and at the same time;
mark the selected pair of nodes as unbuildable when the variant conditions of each of the selected nodes are not satisfiable either separately or at the same time;
add the unbuildable pair of nodes to an unbuildable pairs list; and
perform a clearance analysis process on the product structure, without processing unbuildable pairs on the unbuildable pairs list, and store the results of the clearance analysis process.

9. The client PDM system of claim 8, wherein the client PDM system determines satisfiability of nodes in the VFC forest that correspond to the selected nodes.

10. The client PDM system of claim 8, wherein the client PDM system determines the satisfiability of ancestor nodes in the VFC of nodes that correspond to the selected nodes.

11. The client PDM system of claim 8, wherein the VCF forest is a union of disjoint trees that include all nodes in the product structure tree which have variant conditions.

12. The client PDM system of claim 8, wherein satisfiability determinations for nodes of the VCF are stored in a cache.

13. The client PDM system of claim 8, wherein the client PDM system determines if a common ancestor of nodes in the VCF is satisfiable.

14. The client PDM system of claim 8, wherein the product structure is an unconfigured bill of materials structure.

15. A non-transitory computer-readable medium encoded with computer-executable instructions that, when executed, cause a client product data management (PDM) system to:
receive a product structure having a plurality of nodes with variant conditions;
build a variant condition forest (VCF) corresponding to the product structure;
select a pair of nodes in the product structure;
determine, using the VCF, whether the variant conditions of each of the selected nodes are satisfiable both separately and at the same time;
mark the selected pair of nodes as unbuildable when the variant conditions of each of the selected nodes are not satisfiable either separately or at the same time;
add the unbuildable pair of nodes to an unbuildable pairs list; and
perform a clearance analysis process on the product structure, without processing unbuildable pairs on the unbuildable pairs list, and store the results of the clearance analysis process.

16. The computer-readable medium of claim 15, wherein the client PDM system determines satisfiability of nodes in the VFC forest that correspond to the selected nodes.

17. The computer-readable medium of claim 15, wherein the client PDM system determines the satisfiability of ancestor nodes in the VFC of nodes that correspond to the selected nodes.

18. The computer-readable medium of claim 15, wherein the VCF forest is a union of disjoint trees that include all nodes in the product structure tree which have variant conditions.

19. The computer-readable medium of claim 15, wherein satisfiability determinations for nodes of the VCF are stored in a cache.

20. The computer-readable medium of claim 15, wherein the client PDM system determines if a common ancestor of nodes in the VCF is satisfiable.

* * * * *